(12) United States Patent
Sargent

(10) Patent No.: US 6,594,295 B1
(45) Date of Patent: Jul. 15, 2003

(54) SEMICONDUCTOR LASER WITH DISORDERED AND NON-DISORDERED QUANTUM WELL REGIONS

(75) Inventor: Edward H. Sargent, Toronto (CA)

(73) Assignee: Fox-Tek, Inc., West Chester, PA (US)

( * ) Notice: Subject to any disclaimer, the term of this patent is extended or adjusted under 35 U.S.C. 154(b) by 0 days.

(21) Appl. No.: 09/988,028

(22) Filed: Nov. 16, 2001

(51) Int. Cl.[7] .............................................. H01S 3/20
(52) U.S. Cl. ............................ 372/45; 372/45; 372/50
(58) Field of Search ........................... 372/28, 45, 11, 372/27; 438/22; 359/248

(56) References Cited

U.S. PATENT DOCUMENTS

| | | |
|---|---|---|
| 4,805,179 A | 2/1989 | Harder et al. |
| 4,871,690 A | 10/1989 | Holonyak, Jr. et al. |
| 5,138,625 A * | 8/1992 | Paoli et al. ................... 372/45 |
| 5,298,454 A | 3/1994 | D'Asaro et al. |
| 5,353,295 A | 10/1994 | Holonyak, Jr. et al. |
| 5,395,793 A | 3/1995 | Charbonneau et al. |
| 5,425,043 A | 6/1995 | Holonyak, Jr. et al. |
| 5,455,429 A | 10/1995 | Paoli et al. |
| 5,530,580 A * | 6/1996 | Thompson et al. ......... 359/248 |
| 5,539,763 A | 7/1996 | Takemi et al. |
| 5,574,738 A * | 11/1996 | Morgan ....................... 372/28 |
| 5,574,745 A | 11/1996 | Paoli et al. |
| 5,608,753 A | 3/1997 | Paoli et al. |
| 5,699,375 A * | 12/1997 | Paoli ........................... 372/50 |
| 5,707,890 A | 1/1998 | Emery et al. |
| 5,708,674 A | 1/1998 | Beernink et al. |
| 5,766,981 A | 6/1998 | Thornton et al. |
| 5,771,256 A | 6/1998 | Bhat |
| 5,799,024 A * | 8/1998 | Bowers et al. ................ 372/11 |
| 5,843,802 A * | 12/1998 | Beernink et al. ............. 438/45 |
| 5,878,066 A * | 3/1999 | Mizutani et al. .............. 372/27 |
| 5,882,951 A | 3/1999 | Bhat |
| 5,915,165 A | 6/1999 | Sun et al. |
| 6,027,989 A | 2/2000 | Poole et al. |
| 6,075,804 A * | 6/2000 | Deppe et al. ................. 372/96 |
| 6,233,264 B1 * | 5/2001 | Sato ............................ 372/45 |

OTHER PUBLICATIONS

Journal of Crystal Growth (2000), "Growth of novel InP–based materials by He–plasma–assisted epitaxy," Authors: Pinkney et al.; pp. 237–241. No month.

J. Vac. Sci. Technol. A 16(2), Mar./Apr. 1998, "Characterization of annealed high–resistivity InP grown by He–plasma–assisted epitaxy," Authors: Pinkney et al.; pp. 772–775. No month.

J. Vac. Sci. Technol. A 16(2), Mar./Apr. 1998, "Quantum well intermixing in material system sfor 1.5 $\mu$m (invited)," Authors: Marsh et al.; pp. 810–816. No month.

IEEE Photonics Technology Letters, vol. 8, No. 9, Sep. 1996, "10 Gb/s Wavelength Conversion with Integrated Multiquantum–Well–Based 3–Port Mach–Zehnder Interferometer," Authors: Idler et al.; pp. 1163–1165.

J. Appl. Phys. 79(2), Jan. 15, 1996, "Compositional disordering of InGaAs/GaAs heterostructures by low–temperature–grown GaAs layers," Authors: Tsang et al.; pp. 664–670.

IEEE Photonics Technology Letters, vol. 7, No. 9, Sep. 1995, "Monolithic Integration of InGaAsP–InP Stratined–Layer Distributed Feedback Laser and External Modulator by Selective Quantum–Well Interdiffusion," Authors: Ramdane et al.; pp. 1016–1018.

* cited by examiner

*Primary Examiner*—Paul Ip
*Assistant Examiner*—Hung Vy
(74) *Attorney, Agent, or Firm*—Blank Rome, LLP

(57) ABSTRACT

In a semiconductor laser, non-disordered quantum well active region functions as a lasing region. Surrounding the non-disordered quantum well active region is a disordered quantum well active region which prevents diffusion of injected carriers from the non-disordered quantum well active region or provides a lateral heterobarrier. The disordered quantum well active region is formed by rapid thermal annealing in which defects from one or two InP defect layers diffuse into the parts of the quantum well active region to be disordered.

7 Claims, 2 Drawing Sheets

SEMICONDUCTOR LASER WITH DISORDERED AND NON-DISORDERED QUANTUM WELL REGIONS

FIELD OF THE INVENTION

The present invention is directed to a semiconductor laser and more particularly to a semiconductor laser having disordered and non-disordered quantum well active regions for increased efficiency.

DESCRIPTION OF RELATED ART

Many areas of technology require compact, low-power sources of coherent light which can be coupled into a waveguide such as an optical fiber. To that end, semiconductor lasers and light-emitting diodes are widely used. Typically, a semiconductor laser includes a quantum well active region in which light is produced. However, carriers which have been injected into the quantum well active region can diffuse into surrounding areas of the semiconductor substrate, in which case they are wasted. Such diffusion increases the threshold current required for lasing and reduces the efficiency of the laser.

U.S. Pat. No. 4,805,179 to Harder et al teaches a lateral current injection laser formed in a semiconductor heterostructure. However, Harder et al does not provide a solution to the above-noted difficulty.

U.S. patent application Ser. No. 09/833,078 to Thompson et al, filed Apr. 12, 2001, entitled "A method for locally modifying the effective bandgap energy in indium gallium arsenide phosphide (InGaAsP) quantum well structures," and published on Mar. 14, 2002, as U.S. 2002/0030185 A1, whose entire disclosure is hereby incorporated by reference into the present disclosure, teaches a method for locally modifying the effective bandgap energy of indium gallium arsenide phosphide (InGaAsP) quantum well structures. That method allows the integration of multiple optoelectronic devices within a single structure, each comprising a quantum well structure.

In one embodiment, as shown in FIG. 1A, an InGaAsP multiple quantum well structure 104 formed on a substrate 102 is overlaid by an InP (indium phosphide) defect layer 106 having point defects 108, which are donor-like phosphorus antisites or acceptor-like indium vacancies. Rapid thermal annealing (RTA) is carried out under a flowing nitrogen ambient, using a halogen lamp rapid thermal annealing system. During the rapid thermal annealing, the point defects 108 in the defect layer 106 diffuse into the active region of the quantum well structure 104 and modify its composite structure. The controlled inter-diffusion process causes a large increase in the bandgap energy of the quantum well active region, called a wavelength blue shift.

Another embodiment, as shown in FIG. 1B, uses two defect types, one to generate a wavelength blue shift and the other to decrease carrier lifetime. A first InP defect layer 110 contains slowly diffusing vacancy defects 114, while a second InP defect layer 112 includes rapidly diffusing group V interstitial defects 116. Rapid thermal annealing causes both types of defects to diffuse into the quantum well active region.

However, the prior art has yet to provide a technique to address the issue of diffusion of injected carriers.

SUMMARY OF THE INVENTION

It will be readily apparent that a need exists in the art to overcome the problem of diffusion of injected carriers. It is therefore an object of the invention to provide a semiconductor laser which includes an element for blocking such diffusion.

To achieve the above and other objects, the present invention is directed to the realization of a disordered region of quantum well active region surrounding a region of non-disordered quantum well region in order to prevent diffusion of injected carriers from the non-disordered, light emitting quantum well active region. The method provides blocking of current in a vertical-cavity surface-emitting laser, lowering its threshold current and raising its efficiency. The method provides the formation of a lateral heterobarrier in lateral-current-injected edge-emitting lasers, lowering threshold and raising efficiency. The disordered region can be produced by any of the techniques of the above-cited Thompson et al patent application or by any other suitable intermixing or other disordering techniques.

BRIEF DESCRIPTION OF THE DRAWINGS

A preferred embodiment of the present invention will be set forth in detail with reference to the drawings, in which.

DETAILED DESCRIPTION OF THE PREFERRED EMBODIMENT

Figure 1A:
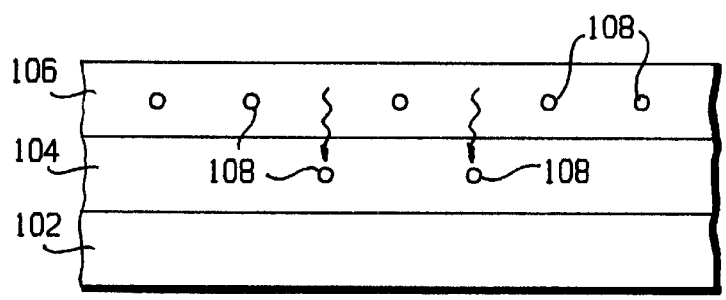
FIGS. 1A and 1B show two embodiments of the technique of the above-cited Thompson et al patent application.
Figure 1B:
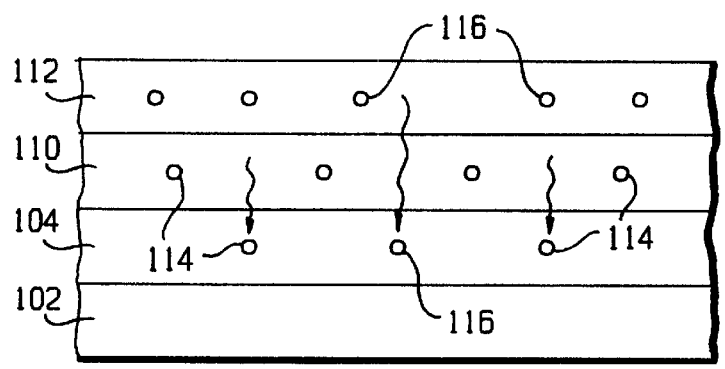
Figure 2:
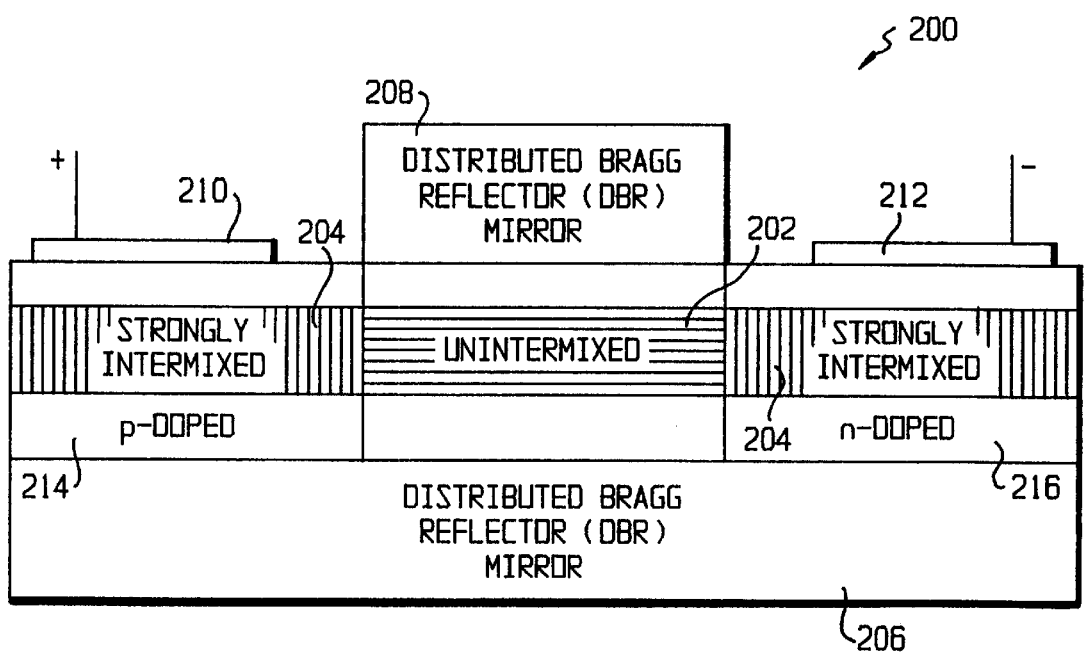
FIG. 2 shows a schematic diagram of a semiconductor laser according to the preferred embodiment.

A preferred embodiment of the present invention will now be set forth in detail with reference to the drawings. In the VCSEL (vertical-cavity surface-emitting laser) 200 of FIG. 2, a non-intermixed quantum well active region 202 is surrounded by a strongly intermixed quantum well active region 204. The strongly intermixed quantum well active region 204 is produced by any of the techniques of the above-cited Thompson et al patent application. The non-intermixed quantum well active region 202 functions as the light-emitting region of the semiconductor laser 200. Also provided in the preferred embodiment are distributed Bragg reflector mirrors 206 and 208, positive and negative electrodes 210 and 212, and corresponding p- and n-doped regions 214 and 216.

Figure 3:
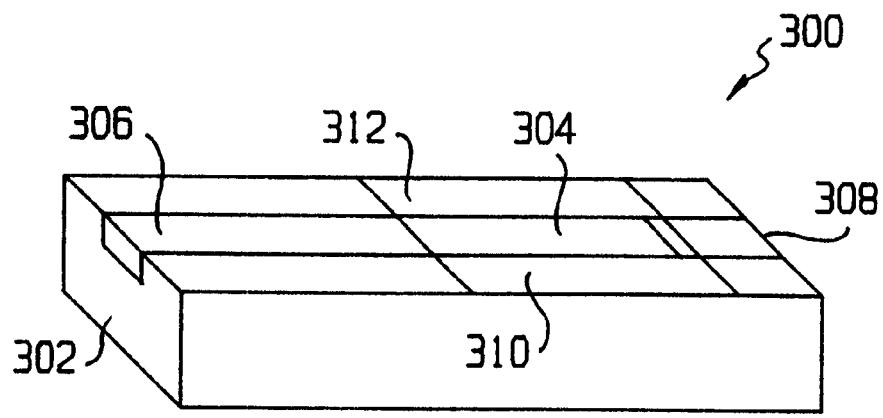
FIG. 3 shows a schematic diagram of a variation of the semiconductor laser of FIG. 2.

FIG. 3 shows a variation of the preferred embodiment, implemented as an edge-emitting laser 300. A semiconductor substrate 302 has formed thereon a non-disordered quantum well active region 304 bounded by Bragg gratings 306 and 308 and by strongly intermixed disordered regions 310 and 312.

Figure 4:
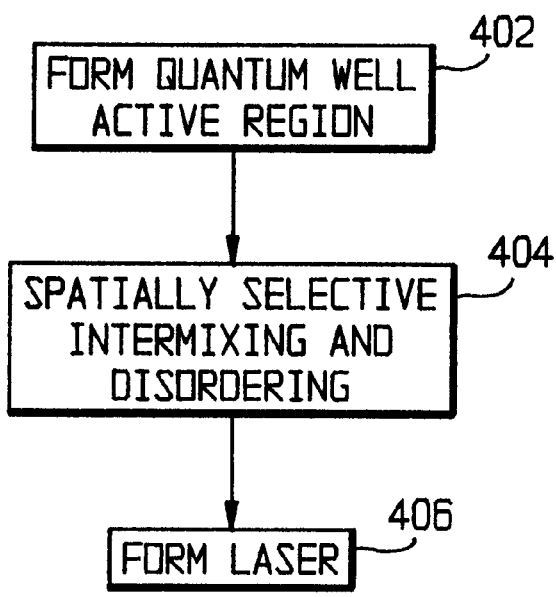
FIG. 4 shows a flow chart of steps for producing the laser of FIG. 2 or FIG. 3.

The laser 200 or 300 is formed in accordance with the process shown in the flow chart of FIG. 4. In step 402, a quantum well active region is formed. In step 404, using any of the techniques of the above-cited Thompson et al patent application for spatially selective intermixing, certain areas of the quantum well active region are disordered through strong intermixing to form the strongly intermixed regions 214, 216 or 310, 312. Then, in step 406, the remainder of the steps for forming a working laser are carried out.

While a preferred embodiment and a variation have been set forth above, those skilled in the art who have reviewed the present disclosure will readily appreciate that other embodiments can be realized within the scope of the invention. For example, any suitable configuration of a semiconductor laser could be used. Therefore, the present invention should be construed as limited only by the appended claims.

What is claimed is:

1. A semiconductor laser comprising:

a semiconductor substrate;

reflectors for defining a laser cavity; and a quantum well active region formed in the semiconductor substrate so as to be disposed between the reflectors, the quantum well active region comprising:
  a first, non-disordered non-intermixed quantum well active region for emitting light; and
  a second, disordered, strongly intermixed quantum well active region surrounding the first quantum well active region, said second, disordered quantum well active region being disordered through intermixing in the second quantum well active region.

2. The semiconductor laser of claim 1, wherein the semiconductor laser is a surface-emitting laser.

3. The semiconductor laser of claim 1, wherein the semiconductor laser is an edge-emitting laser.

4. The semiconductor laser of claim 1, wherein the quantum well active region is an indium gallium arsenide phosphide (InGaAsP) quantum well active region.

5. A method of making a semiconductor laser, the method comprising:

(a) forming, in a semiconductor substrate, a semiconductor quantum well structure comprising a quantum well active region;

(b) carrying out spatially selective intermixing in part of the quantum well active region to define a first, non-disordered, non-intermixed quantum well active region in which the spatially selective intermixing is not carried out and a second, disordered, strongly intermixed quantum well active region surrounding the first quantum well active region; and (c) forming reflectors to define a laser cavity which contains the first quantum well active region.

6. The method of claim 5, wherein the quantum well active region is an indium gallium arsenide phosphide (InGaAsP) quantum well active region.

7. The method of claim 6, wherein step (b) comprises rapid thermal annealing for controlled diffusion of defects into the second quantum well active region.

* * * * *